United States Patent [19]
Ishii et al.

[11] Patent Number: 5,204,786
[45] Date of Patent: Apr. 20, 1993

[54] DIGITAL IMAGE RECORDING AND REPRODUCING APPARATUS

[75] Inventors: Tsuneo Ishii; Tadashi Ueda; Kazuhisa Yoshita, all of Tokorozawa, Japan

[73] Assignee: Pioneer Electronic Corporation, Tokyo, Japan

[21] Appl. No.: 540,247

[22] Filed: Jun. 19, 1990

[30] Foreign Application Priority Data

Jun. 20, 1989 [JP] Japan .................. 1-157465

[51] Int. Cl.$^5$ .................................... G11B 5/09
[52] U.S. Cl. .................................... 360/32
[58] Field of Search ........................ 360/32; 369/59

[56] References Cited

PUBLICATIONS

*Digital Logic and Computer Design* by M. Morris Mano, Prenctice-Hall Inc ©1979, pp. 256–266.

*Primary Examiner*—Vincent P. Canney
*Attorney, Agent, or Firm*—Sughrue, Mion, Zinn, Macpeak & Seas

[57] ABSTRACT

A digital image recording and reproducing apparatus includes a serial-to-parallel converter connected between an image memory and a data memory, for converting serial image data from the image memory into parallel image data, and a parallel-to-serial converter connected between the image memory and the data memory, for converting parallel image data from the data memory into serial image data. The serial-to-parallel converter is operated when the image data are to be transferred from the image memory to the data memory, and the parallel-to-serial converter is operated when the image data are to be transferred from the data memory to the image memory. Since the data can be transferred from the data memory to the image memory with a minimum number of bits required to allow displayed images to be recognized, the time required to reproduce images is shortened, and hence the image retrieval time is also shortened.

23 Claims, 6 Drawing Sheets

DIGITAL IMAGE RECORDING AND REPRODUCING APPARATUS

BACKGROUND OF THE INVENTION

The present invention relates to a digital image recording and reproducing apparatus for recording digital images in and reproducing digital images stored in an optical disk or the like, and more particularly to a digital image recording and reproducing apparatus for rapidly browsing through still images that are successively displayed to a user, who retrieves a desired still image therefrom.

Write-once-read-many (WORM) optical disks on which the user can record data represent a large-capacity digital recording medium. For example, the WORM optical disk with a diameter of 5 inches has a recording capacity of 320 Mbytes on one side alone.

A 5-inch optical disk has a track extending spirally from the inner periphery to the outer periphery of the disk and having about 20,000 turns. The track is circumferentially divided into 32 sectors. A track turn has a first recording pit group with a leading address given to its leading end and a second recording pit group with a leading address given to its leading end. Similarly, leading addresses are given to the leading ends of each succeeding recorded pit group. Each sector of one track turn has a recording capacity of 512 bytes.

If television images are to be recorded as still image data on the optical disk, then about 1,000 sectors are required to store one frame of image, and data on about 700 still images can be recorded on one optical disk.

A conventional still image recording and reproducing apparatus for reproducing recorded still images from such an optical disk employs 8 bits for quantizing image data. Therefore, the image memory used in the apparatus has a large storage capacity, and requires a long time to reproduce an entire still image.

More specifically, when still images are successively displayed at a high speed for image retrieval, the still images are roughly checked and browsed by a user until a desired still image is recognized. However, the conventional still image recording and reproducing apparatus takes too a long time to reproduce one still image, and as a result, it is time-consuming to browse all the still images for image retrieval.

SUMMARY OF THE INVENTION

It is an object of the present invention to provide a digital image recording and reproducing apparatus which reproduces each image in a reduced period of time, so that the time required to reproduce all stored images successively for image retrieval can be reduced.

According to the present invention, there is provided a digital image recording and reproducing apparatus comprising an image memory for storing image data to be displayed, a data memory for storing image data, a serial-to-parallel converter connected between the image memory and the data memory, for converting serial image data from the image memory into parallel image data, a parallel-to-serial converter connected between the image memory and the data memory, for converting parallel image data from the data memory into serial image data, and control means for operating the serial-to-parallel converter when the image data are to be transferred from the image memory to the data memory, and for operating the parallel-to-serial converter when the image data are to be transferred from the data memory to the image memory.

When the image data are transferred from the image memory to the data memory, the serial-to-parallel converter is controlled to read the image data from the image memory parallel image data. When the image data are transferred from the data memory to the image memory, the parallel-to-serial converter is controlled to read the image data from the data memory as serial data. Since the data can be transferred from the data memory to the image memory in the form of a minimum number of bits which are required to allow displayed images to be recognized, the time required to reproduce images is shortened, and hence the image retrieval time is also shortened.

The above and other objects, features and advantages of the present invention will become more apparent from the following description when taken in conjunction with the accompanying drawings in which a preferred embodiment of the present invention is shown by way of illustrative example.

DETAILED DESCRIPTION OF THE INVENTION

As conducive to a full understanding of the nature and utility of the present invention, a brief consideration of a typical conventional digital image recording and reproducing apparatus will be first presented below with reference to FIGS. 6 and 7 principally for the purpose of comparison therebetween.

Figure 6:
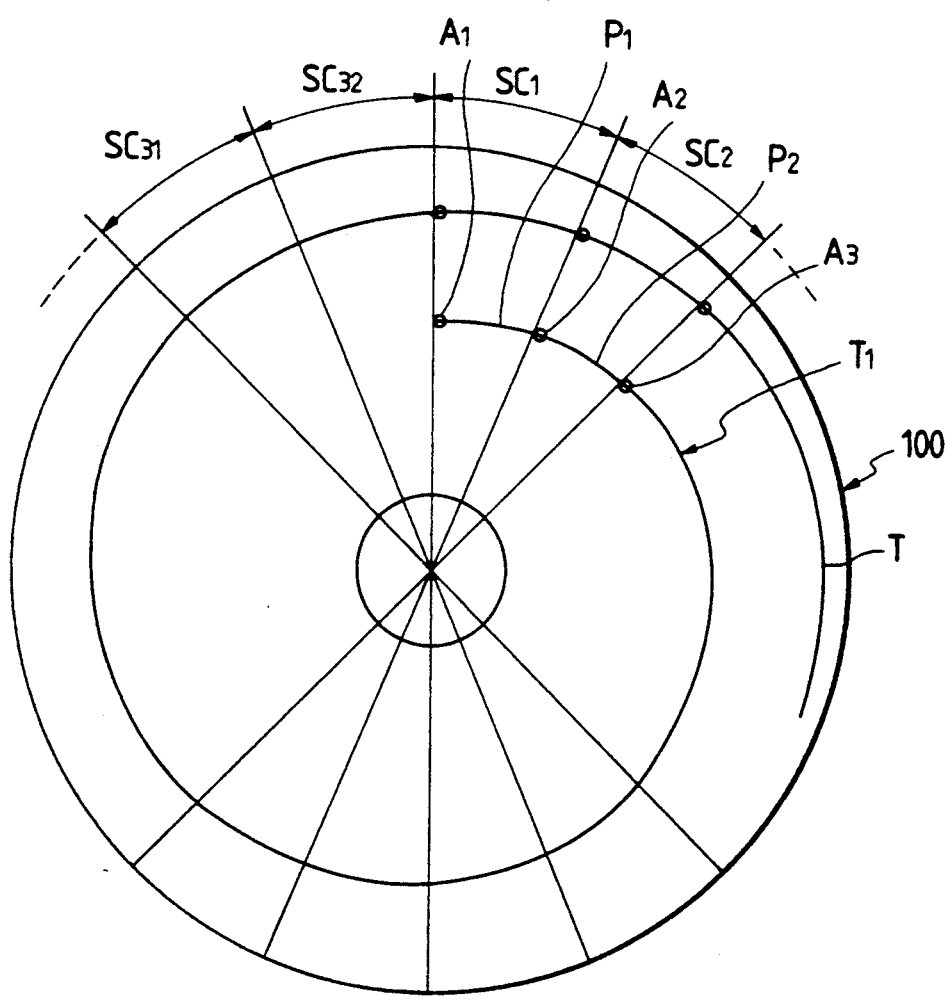
FIG. 6 is a structural view of a conventional optical disk.

FIG. 6 shows recording format of a conventional optical disk.

A 5-inch optical disk 100 has a T track extending spirally from the inner periphery to the outer periphery of the disk and having about 20,000 turns. The track T is circumferentially divided into 32 sectors SC1 to SC32. A track turn has a first recording pit group P1 with a leading address A1 given to its leading end, and a second recording pit group P2 with a leading address A2 given to its leading end. Similarly, leading addresses A3, A4–A32 are given to the leading ends of the following recording pit groups P3, P4–P32. Each sector of one track turn has a recording capacity of 512 bytes.

Figure 7:
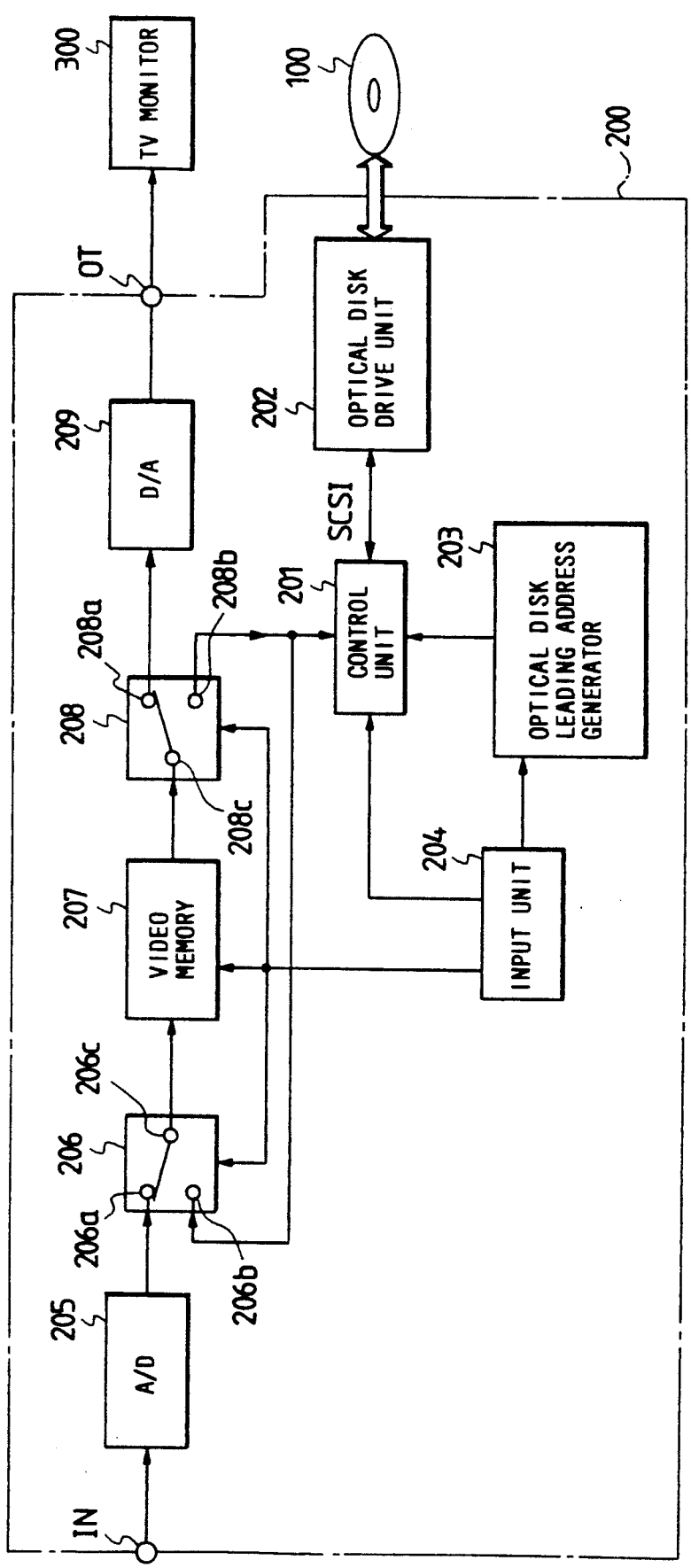
FIG. 7 is a block diagram of a conventional digital image recording and reproducing apparatus.

FIG. 7 shows a conventional digital image recording and reproducing apparatus 200 for reproducing recorded still images from an optical disk. The digital image recording and reproducing apparatus 200 has a control unit 201 and an optical disk drive unit 202 connected to the control unit 201. An optical disk 100 can be loaded into the optical disk drive unit 202. The control unit 201 and the optical disk drive unit 202 are connected to each other by an SCSI (Small Computer System Interface). The control unit 201 has a first input terminal connected to a first output terminal of an input unit 204. The input unit 204 has a second output connected through an optical disk leading address generator 203 to a second input terminal of the control unit 201.

A video signal to be recorded is applied through an input terminal IN of the apparatus 200 to an analog-to-digital (A/D) converter 205 whose output terminal is coupled to a first fixed terminal 206a of a first changeover switch 206. The first changeover switch 206 has a movable contact 206c connected to an input terminal of an video memory 207. The output terminal of the video memory 207 is connected to a movable contact 208c of a second changeover switch 208. The second changeover switch 208 has a first fixed terminal 208a connected to the input terminal of a digital-to-analog (D/A) converter 209 whose output terminal is connected to an output terminal OT of the apparatus 200. A television picture monitor 300 is connected to the output terminal OT. The first changeover switch 206 has a second fixed terminal 206b connected to a second fixed terminal 208b of the second changeover switch 208 and also to a third input terminal of the control unit 201. The input unit 204 has a third output terminal connected to control terminals of the first and second changeover switches 206, 208 and a control terminal of the video memory 207.

The digital image recording and reproducing apparatus 200 has the following modes of operation:

(1) The mode in which image data supplied through the input terminal IN are recorded in the video memory 207;

(2) The mode in which the data recorded in the video memory 207 are displayed on the television picture monitor 300;

(3) The mode in which the data recorded in the video memory 207 are transferred to the optical disk drive unit 202; and (4) The mode in which the data are read from the optical disk drive unit 202 and displayed on the television picture monitor 300.

These modes of operation will be described below.

(1) The Mode in Which Image Data Supplied Through the Input Terminal IN are Recorded in the Video Memory 207

When a predetermined input signal is applied to the input unit 204, the movable contact 206c of the first changeover switch 206 is shifted to the first fixed contact 206a, making the video memory 207 ready to record image data. A video signal which is applied to the input terminal IN is converted to digital data by the A/D converter 205, and the digital data are recorded in the video memory 207 through the first changeover switch 206.

(2) The Mode in Which the Data Recorded in the Video Memory 207 are Displayed on the Television Picture Monitor 300

When another predetermined input signal is applied to the input unit 204, the movable contact 208c of the second changeover switch 208 is shifted to the first fixed contact 208a. The digital data which are read from the video memory 207 are sent through the first fixed contact 208a of the second changeover switch 208 to the D/A converter 209 by which the digital data are converted into an analog video signal. The video signal is then transmitted through the output terminal OT to the television picture monitor 300 where a corresponding image is displayed on the display screen.

(3) The Mode in Which the Data Recorded in the Video Memory 207 are Transferred to the Optical Disk Drive Unit 202

The optical disk 100 is previously loaded in the optical disk drive unit 202, and another predetermined input signal is applied to the input unit 204. In the case of 8-bit data, a video signal supplied through the input terminal IN is converted into 8-bit data sets to be stored in the video memory 207. The 8-bit data sets stored in the video memory 207 are transferred to the optical disk 100 without any convertion of the 8-bit data sets.

(4) The Mode in Which the Data are Read from the Optical Disk Drive Unit 202 and Displayed on the Television Picture Monitor 300

In response to a predetermined input signal applied to the input unit 204, the data stored in the optical disk 100 are transferred through the control unit 201 and the first changeover switch 206 and stored in the video memory 207. Thereafter, the data are read from the video memory 207 and transmitted through the second changeover switch 208 to the D/A converter 209 by which the data are converted into an analog image signal. The analog image signal is then sent from the output terminal OT to the television picture monitor 300.

Figure 1:
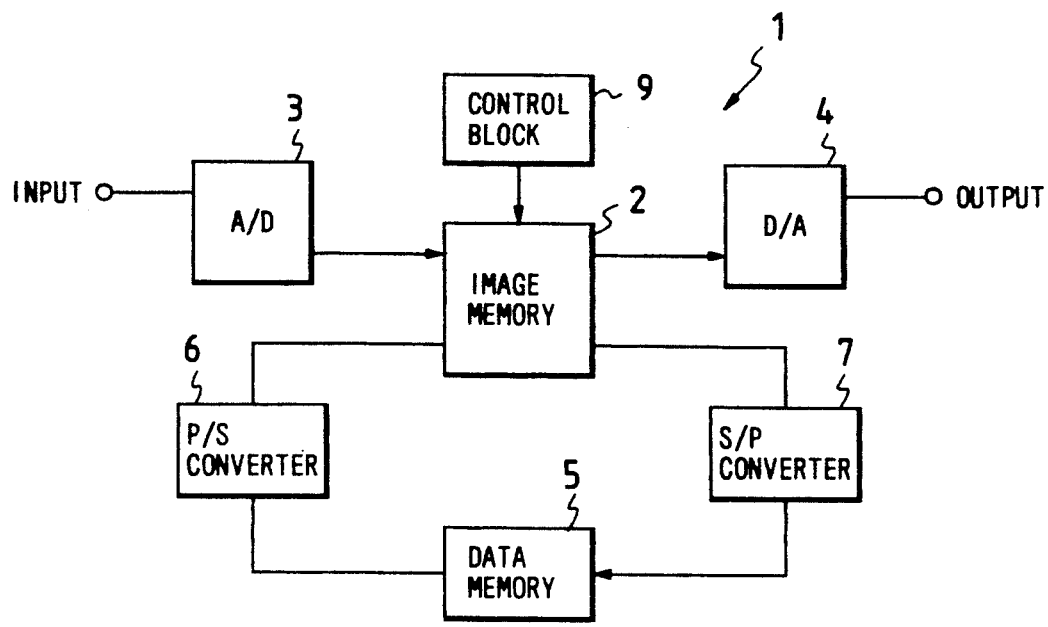
FIG. 1 is a block diagram of a digital image recording and reproducing apparatus according to the present invention.

A digital image recording and reproducing apparatus according to the present invention will be described below. Each image is formed of multiple picture elements each of which is defined by a multi-bit data set (such as an 8-bit data set). FIG. 1 shows in block form the digital image recording and reproducing apparatus, generally indicated by the reference numeral 1. The digital image recording and reproducing apparatus 1 has an image memory 2 with a storage capacity of 64 kilobytes. An A/D converter 3 is connected to an input terminal of the image memory 2, and a D/A converter 4 is connected to an output terminal of the image memory 2.

A data memory 5 is also connected to the image memory 2 through a parallel-to-serial (P/S) converter 6 and a serial-to-parallel (S/P) converter 7. A control block 9 is also coupled to the image memory 2.

Figure 3:
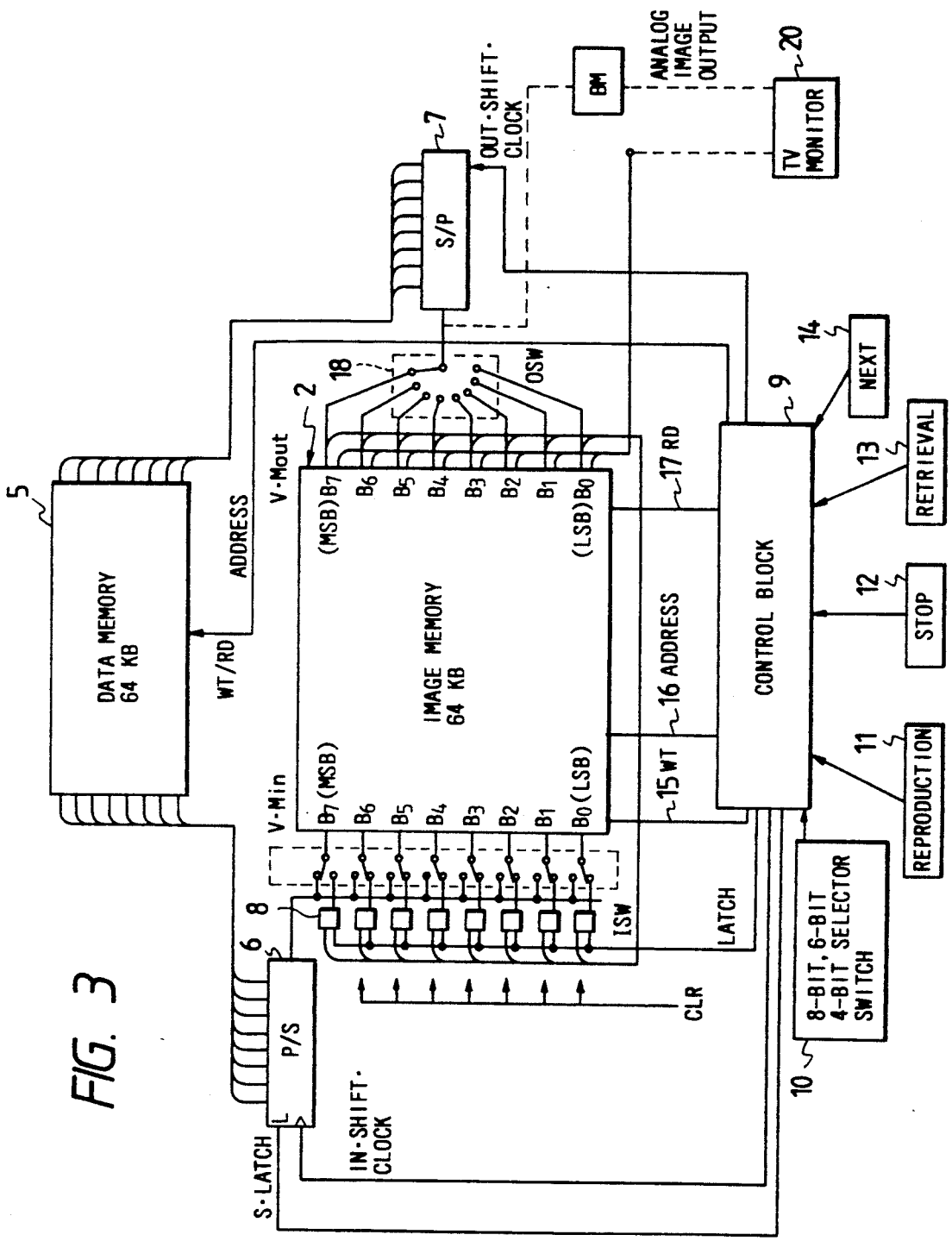
FIG. 3 is a block diagram of the digital image recording and reproducing apparatus according to the present invention.

The digital image recording and reproducing apparatus 1 is illustrated in greater detail in FIG. 3. In FIG. 3, the image memory 2 has an input terminal assembly V.Min which comprises input terminals B0 (LSB), B1, B2, B3, B4, B5, B6, B7 (MSB) for 8 bits, and an output terminal assembly V.Mout which comprises output terminals B0, (LSB), B1, B2, B3, B4, B5, B6, B7 (MSB) for 8 bits. The input terminal assembly V.Min is connected to a changeover switch assembly ISW which can selectively connect the input terminal assembly V.Min to the P/S converter 6 or a plurality of latch circuits 8 associated with the changeover switch assembly ISW. The control block 9 is connected to a selector switch 10 for selecting one of 8-bit, 6-bit, and 4-bit processing modes, a reproduction instructing switch 11, a stop instructing switch 12, a retrieval instructing switch 13, and a next instructing switch 14. The control block 9 is also connected to the latch circuits 8. The control block 9 is connected to the image memory 2 through a write signal line 15, an address signal line 16, and a read out signal line 17.

The output terminals B0, B1, B2, B3, B4, B5, B6, B7 of the image memory 2 are connected to a switch OSW 18 by which these output terminals are selectively coupled to the S/P converter 7.

Figure 2A:
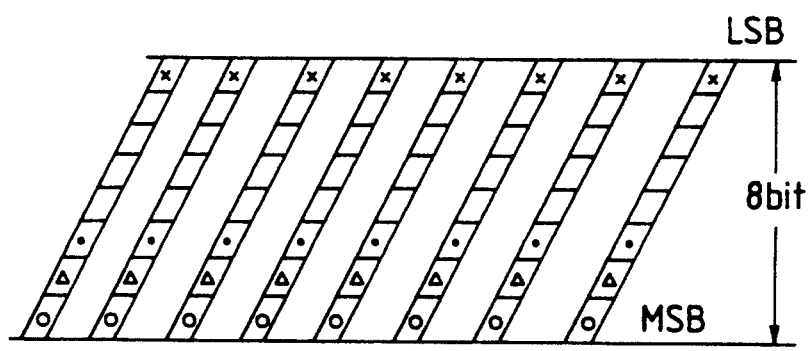
FIGS. 2(a) and 2(b) are diagrams showing the transfer of data in a data memory in the digital image recording and reproducing apparatus according to the present invention.
Figure 2B:
Figure 4:
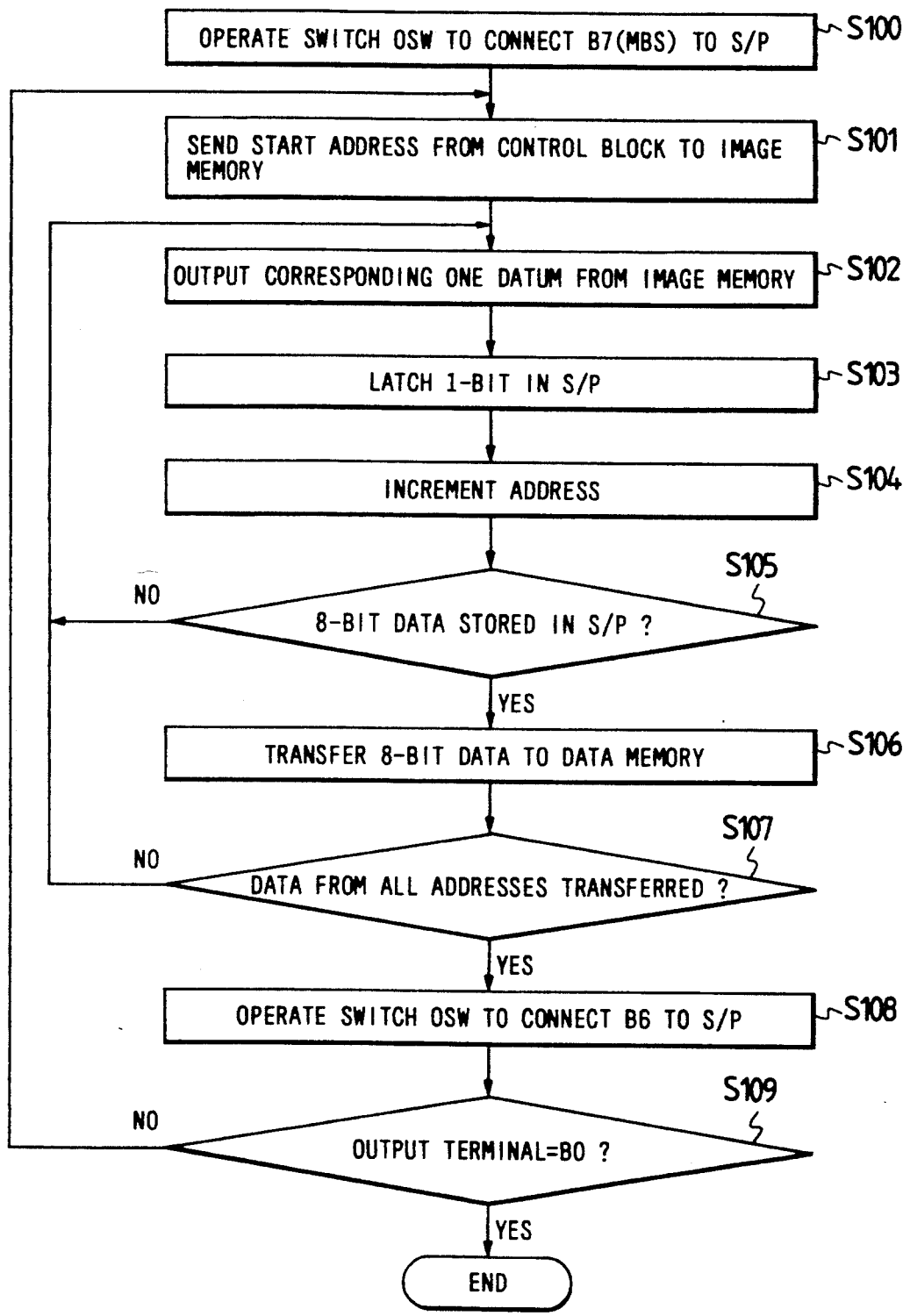
FIG. 4 is a flowchart of an operation sequence for transferring data from an image memory to the data memory.

The digital image recording and reproducing apparatus 1 thus constructed operates as follows:

First, the transfer of data from the image memory 2 to the data memory 5 will be described with reference to the flowchart of FIG. 4. The movable contact of the switch OSW 18 is connected to the output terminal B7 (MSB) of the image memory 2, thereby coupling the output terminal B7 to the S/P converter 7 in a step S100. Then, a start address is transmitted from the control block 9 through the address signal line 16 to the image memory 2 in a step S101. One data point corresponding to the start address is outputted as a first data point from the image memory 2 in step S102. The first data point is supplied to the S/P converter 7 and is latched in the S/P converter in step S103. Then, the address is incremented in step S104 to read the next data point from the next 8-bit data value from the image memory 2 one by one on the basis of each signal given by the read out signal line 17 the MSB data of the 8-bit data value is stored as a set of MSB signals in the S/P converter 7 while the data supplied to the S/P converter 7 are shifted one by one in response to out-shift-clock signals from the control block 9. It is determined whether the S/P converter 7 holds 8 bits of data or not in step S105. If the converter 7 holds 8-bits, then the data is transmitted from the S/P converter 7 to the data memory 5 in step S106. In the data memory 5, the data which are stored in a serial fashion in the image memory 2, as shown in FIG. 2(a), are arranged in a parallel fashion at the respective addresses. The above process is repeated while incrementing the address until the transfer of all of the MSB data corresponding to all of the picture elements is completed in step S107. Thereafter, the movable contact of the switch OSW is connected to the output terminal B6 of the image memory 2 so that the output terminal B6 is connected to the S/P converter 7 in a step S108. The steps S101 through S108 are repeated until all LSB bits of the 8-bit data values are read from the output terminal B0 of the image memory 2, i.e., the output terminal connected to the S/P converter 7 becomes B0 in a step S109.

However, while the MSB data are sent to the data memory 5 via the S/P converter 7, the MSB data are outputted to the TV monitor 20 to form a still image represented by the MSB of each data value. The 1 bit data image is very vague.

Figure 5:
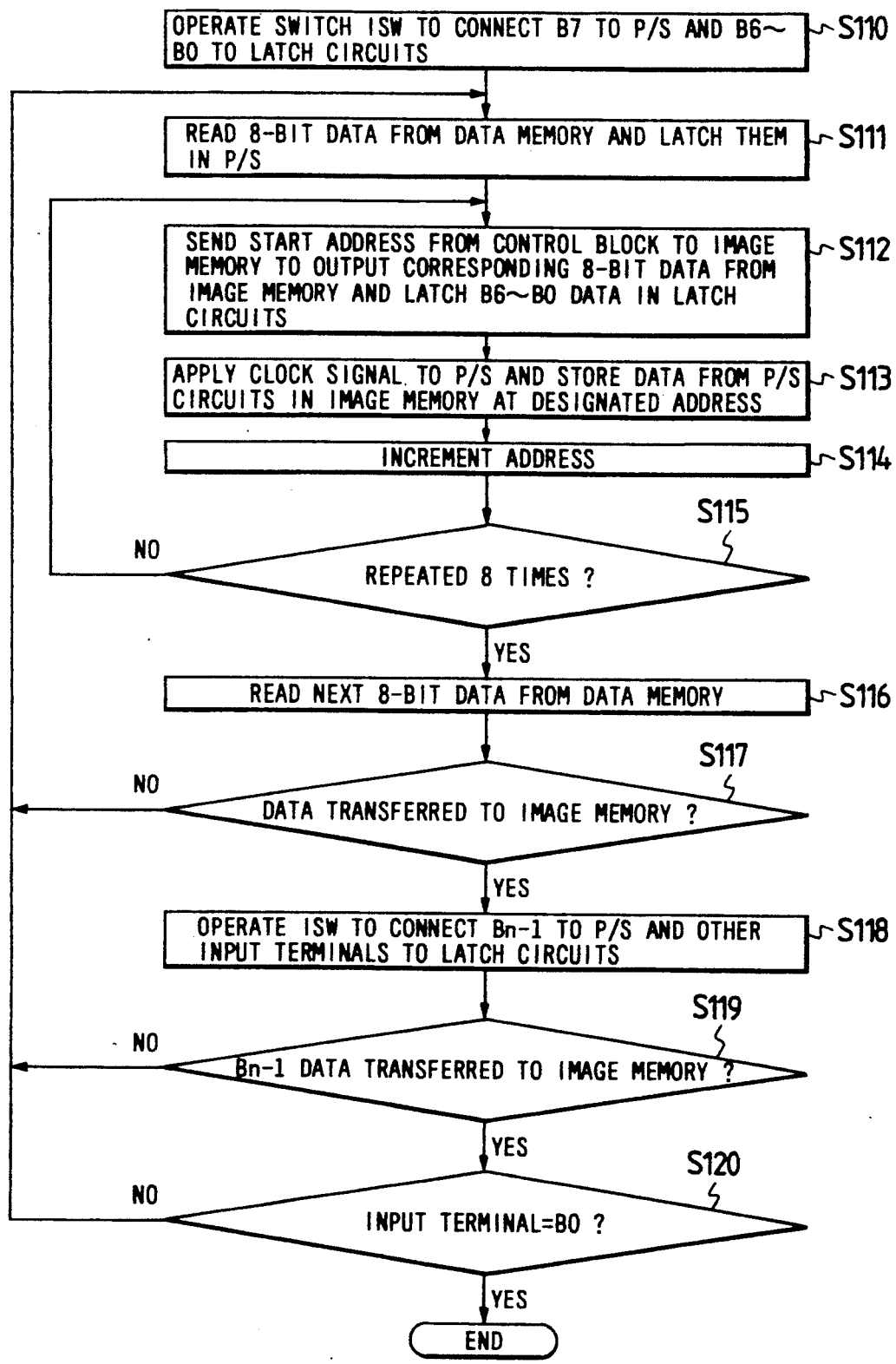
FIG. 5 is a flowchart of an operation sequence for transferring data from the data memory to the image memory.

Data transferred from the image memory 2 to the data memory 5 is transferred therefrom to the image memory 2 as shown in FIG. 5. When transferring MSB data, the changeover switch assembly ISW is operated such that its movable contact connected to the input terminal B7 of the image memory 2 is connected to the P/S converter 6 and the other movable contacts connected to the input terminals B6 through B0 are connected to the latch circuits 8 in step S110. The 8 bit data sets of the MSB data are read from the data memory 5 in response to read out address signals and latched in the P/S converter 6 in response to a latch signal in a step S111. The control block 9 outputs a start address to the image memory 2, which then outputs 8 bit sets of the MSB data corresponding to the start address, and the respective data which correspond to the input terminals B6 through B0 are latched in the latch circuits 8 in a step S112. An in-shift-clock signal is supplied to the P/S converter 6 to enable it to output the data one by one. Now, the data from the P/S converter 6 are stored at the designated address in a step S113. The address is incremented in a step S114. The steps S112, S113, S114 are repeated eight times until all the data latched in the P/S converter 6 are transferred to the image memory 2 in a step S115. Next 8-bit data are read from the data memory 5 in a step S116, and similarly stored in the image memory 2. The steps S111, S112, S113, S114, S115 are repeated until all MSB data are transferred from the data memory 5 to the image memory 2 in a step S117. Then, the input terminal B6 is connected to the P/S converter 6 and the other input terminals are connected to the latch circuits 8 in a step S118. The steps S111 through S117 are repeated to transfer all data corresponding to the terminal B6 from the data memory 5 to the image memory 2 in a step S119. In this manner, the changeover switch assembly ISW is operated to successively connect the input terminals B5 through B0 to the P/S converter 6 while connecting the other input terminals to the latch circuits 8, so that all data are transferred from the data memory 5 to the image memory 2. Thereafter, if the input terminal connected to the P/S converter 6 is B0 in a step S120, then the data transfer from the data memory 5 to the image memory 2 is brought to an end.

In more detail, when the data from the P/S converter 6 is stored in the image memory 2 through the input terminal B7 (MSB), the data latched in the latch circuits 8 corresponding to the other bits, i.e., the input terminals B6 through B0, may be cleared. With the latched data being thus cleared, the data of the previous image which are stored in the image memory 2 are cleared except the MSB data. Upon completion of the transfer of all the MSB data, image data equivalent to those quantized using 1 bit are transferred to the image memory 2.

After all MSB data are processed in the above manner, the movable contact of the output switch OSW 18 is connected to the output terminal B6 of the image memory 2 while the input terminal B6 is connected to the P/S converter 6 and the other input terminals are connected to the latch circuits 8. At this time, the latch circuit 8 corresponding to the MSB terminal B7 of the ISW switch holds data which correspond respectively to the same address in the image memory 2. That is, when a set of data with respect to the MSB terminal B7 and the terminal B6 at the same address is completed, the data are inputted into the image memory 2 at the same time. At this time, no data has been input into the other input terminals B5 to B0. At the same time, 2 bit data of B7 and B6 are output to the TV monitor 20 to form a still image represented by 2 data bits from each data value. The still image becomes clearer than that image represented by 1 bit data (MSB data). In the same manner, the next data with respect to the terminals B5 are processed to output image data to the TV monitor 20 to form gradually a clearer still image. If an operator can acknowledge the still image clearly when the image data with respect to the terminals B4 are processed, a retrieval operation is finished and a next retrieval operation is started.

The data in the image memory are outputted therefrom little by little to display a still image in a manner that the still image is first represented by a small number of bits and gradually represented by a larger number of bits.

The image memory 2 is a three-port memory having one input port and two output ports. The output port which is not used when the data are transferred from the image memory 2 to the data memory 5 is connected to a television picture monitor 20. If the image memory 2 is a two-port memory having one input port and one output port, then since the output port cannot be used for data transfer to the data memory 5 in timed relation to data transfer to the television picture monitor 20, a dedicated buffer memory BM is required to be connected between the image memory 2 and the television picture monitor 20. With such an arrangement, when the transfer of MSB data from the data memory 5 to the image memory 2 is finished, all data stored in the image memory 2 at the time are copied in the buffer memory, such a copying process is repeated with respect to the data corresponding to the input terminals B6 through B0, so that an image can be displayed on the television picture monitor 20 based on the copied data in the buffer memory.

The 8-bit, 6-bit, and 4-bit processing modes are selected one at a time by the selector switch 10 connected to the control block 9. If the 6-bit processing mode is selected by the selector switch 10, the transfer of data from the data memory 5 to the image memory 2 is completed when all 6-bit data corresponding to the input terminals B7 (MSB), B6, B5, B4, B3, B2 have been transferred.

To successively reproduced images based on the data stored in the data memory 5, a retrieval mode is instructed by the retrieval instructing switch 13 connected to the control block 9. At this time, the control block 9 successively transfers the data, beginning with the MSB data, from the data memory 5 to the image memory 2. As the quantizing bit number progressively increases from 1 to 2 to 3 to 4 and so on, the user who watches the television picture monitor 20 starts to recognize a displayed image. If the user can first recognize a displayed image when the quantizing bits are 5 bits, then the user operates on the next instructing switch 14 to transfer a next image from the data memory 5. Inasmuch as a next image can be called on the basis of displayed images which are reproduced using a fewer number of quantizing bits, a desired image can be retrieved at a higher speed.

Since the serial-to-parallel converter and the parallel-to-serial converter are connected between the image memory and the data memory, as described above, the time required to process images is greatly shortened.

Although a certain preferred embodiment has been shown and described, it should be understood that many changes and modifications may be made therein without departing from the scope of the appended claims.

What is claimed is:

1. A digital image recording and reproducing apparatus comprising:
    an image memory for storing image data as multi-bit data values to be displayed;
    a data memory for storing image data;
    a serial-to-parallel converter, connected between said image memory and said data memory, for converting serial image data from said image memory into parallel image data;
    a parallel-to-serial converter, connected between said image memory and said data memory, for converting parallel image data from said data memory into serial image data;
    control means for operating said serial-to-parallel converter when said image data are to be transferred from said image memory to said data memory, and for operating said parallel-to-serial converter when said image data are to be transferred from said data memory to said image memory; and
    a TV monitor for displaying said image data, wherein a partial digital image is displayed on said TV monitor when one bit from each multi-bit data value of said image data is transferred to the image memory and before any other bits from each multi-bit data value are transferred to the image memory.

2. A digital image recording and reproducing apparatus according to claim 1, further including a switch for selectively connecting output terminals of said image memory to said serial-to-parallel converter.

3. A digital image recording and reproducing apparatus according to claim 1, further including a plurality of latch circuits connected to input terminals of said image memory, and a switch for selectively connecting said latch circuits to said parallel-to-serial converter.

4. A digital image recording and reproducing apparatus according to claim 1, wherein the image memory stores image data as uniquely addressed serial data values, each of which includes a predetermined number of bits defining an image, and the data memory stores image data as uniquely addressed parallel data sets, each of which includes bits from multiple serial data values, said control means comprising means for controlling said serial-to-parallel (S/P) converter to convert said serial data values into said parallel data sets, said S/P converter first and successively converting all most significant bits from the serial data values before converting any other bits from the serial data values.

5. A digital image recording and reproducing apparatus according to claim 1, wherein the image memory stores image data as uniquely addressed serial data values that define an image, and the data memory stores image data as uniquely addressed parallel data sets, each of which includes bits from multiple serial data values, said control means comprising means for controlling said parallel-to-serial (P/S) converter to convert parallel data sets, each composed of a predetermined number of bits, into serial data values, said P/S converter successively and firstly converting parallel data sets only composed of most significant bits (MSB) for each serial data value and lastly converting parallel data sets only composed of least significant bits (LSB) for each serial data value.

6. A digital image recording and reproducing apparatus according to claim 1, wherein the image data stored in the image memory includes a plurality of multi-bit data values, each of which is stored at a unique address in the image memory, said serial-to-parallel (S/P) converter serially accepting a single bit from each data value and outputting, in parallel, groups of said single bits as parallel data sets.

7. A digital image recording and reproducing apparatus according to claim 6, wherein the parallel-to-serial converter accepts, in parallel, each multi-bit data set and serially outputs bits from each of the data sets, wherein each serially output bit is written to a different address in the image memory.

8. A digital image recording and reproducing apparatus according to claim 1, further including an output switch positioned between and operated to separately connect output terminals of the image memory and the serial-to-parallel (S/P) converter, each output terminal having a one-to-one correspondence with the bits in each multi-bit data value, wherein a movable contact in the output switch remains connected to one output terminal until every bit corresponding to said one terminal is transferred to the data memory.

9. A digital image recording and reproducing apparatus according to claim 1, further comprising:
   a latch circuit connected to the image memory output terminals, for holding bit values detected at said output terminals, and
   an input switch for connecting the latch circuit and parallel-to-serial (P/S) converter to input terminals of the image memory, said input switch maintaining a connection between one input terminal and the P/S converter until all multi-bit data sets corresponding to the connected input terminals are transferred to 10. A digital image recording and reproducing apparatus according to claim 1, further comprising:
    a selector switch connected to the controller, for selecting a maximum number of bits for each multi-bit data value to be transferred to the image memory, in order to stop data transfer from the data memory to the image memory before every bit of each multi-bit data value is transferred.

11. A digital image recording and reproducing apparatus comprising:
    image memory for storing image data including a plurality of multi-bit data values, wherein each of said multi-bit data values is stored at a unique address in said image memory;
    data memory for storing converted image data including a plurality of multi-bit data sets, wherein each of said multi-bit data sets is stored at a unique address in said data memory, each of said multi-bit data sets including one bit from each of a group of the multi-bit data values;
    a serial-to-parallel converter, connected between said image and data memory, for converting said multi-bit data values into converted data sets;
    a parallel-to-serial converter, connected between said image and data memory, for converting said converted data sets back into multi-bit data values;
    a controller for operating said serial-to-parallel and parallel-to-serial converters to transfer image data between said image and data memory; and
    a TV monitor for displaying said image data, wherein a partial digital image is displayed on said TV monitor when one bit from each multi-bit data value is transferred to said image memory and before any other bits from each multi-bit data value are transferred to said image memory.

12. A digital image recording and reproducing apparatus according to claim 11, wherein the serial-to-parallel converter serially accepts one bit from each of a group of multi-bit data values and outputs, in parallel, a multi-bit data set containing one bit from each of the data values in said group.

13. A digital image recording and reproducing apparatus according to claim 11, wherein the parallel-to-serial converter accepts, in parallel, each multi-bit data set and serially outputs bits in each of the data sets, wherein each serially output bit is written to a different address in the image memory.

14. A digital image recording and reproducing apparatus according to claim 11, further including an output switch positioned between and operated to separately connect output terminals of the image memory and the serial-to-parallel (S/P) converter, each output terminal having a one-to-one correspondence with the bits in each multi-bit data value, wherein a movable contact in the output switch remains connected to one output terminal until every bit corresponding to said one terminal is transferred to the data memory.

15. A digital image recording and reproducing apparatus according to claim 11, further comprising:
    a latch circuit connected to the image memory output terminals, for holding bit values detected at said output terminals, and
    an input switch for connecting the latch circuit and parallel-to-serial (P/S) converter to input terminals of the image memory, said input switch maintaining a connection between one input terminal and the P/S converter until all multi-bit data sets corresponding to the connected input terminal are transferred to the image memory.

16. A digital image recording and reproducing apparatus according to claim 11, further comprising:
    a selector switch connected to the controller, for selecting a maximum number of bits for each multi-bit data value to be transferred to the image memory, in order to stop data transfer from the data memory to the image memory before every bit of each multi-bit data value is transferred.

17. A digital image recording and reproducing apparatus comprising:
    an image memory for storing image data to be displayed;
    a data memory for storing image data;
    a serial-to-parallel converter, connected between said image memory and said data memory, for converting serial image data from said image memory into parallel image data;
    a parallel-to-serial converter, connected between said image memory and said data memory, for converting parallel image data from said data memory into serial image data; and
    control means for operating said serial-to-parallel converter when said image data are to be transferred from said image memory to said data memory, and for operating said parallel-to-serial converter when said image data are to be transferred from said data memory to said image memory, wherein said image memory stores image data as uniquely addressed serial data values, each of which includes a predetermined number of bits defining an image, said data memory storing image data as uniquely addressed parallel data sets, each of which includes bits from multiple serial data values,
    said control means comprising:
        means for controlling said serial-to-parallel converter to convert said serial data values into said parallel data sets, said serial-to-parallel converter first and successively converting a most significant bit from each of said serial data values before converting any other bits from said serial data values.

18. A digital image recording and reproducing apparatus comprising:

an image memory for storing image data to be displayed;

a data memory for storing image data;

a serial-to-parallel converter, connected between said image memory and said data memory, for converting serial image data from said image memory into parallel image data;

a parallel-to-serial converter, connected between said image memory and said data memory, for converting parallel image data from said data memory into serial image data; and control means for operating said serial-to-parallel converter when said image data are to be transferred from said image memory to said data memory, and for operating said parallel-to-serial converter when said image data are to be transferred from said data memory to said image memory, wherein said image memory stores image data as uniquely addressed serial data values that define an image and said data memory stores image data as uniquely addressed parallel data sets, each of which is composed of a predetermined number of bits and includes bits from multiple serial data values, said control means comprising:

means for controlling said parallel-to-serial converter to convert said parallel data sets into said serial data values, said parallel-to-serial converter successively and firstly converting parallel data sets only composed of most significant bits from said serial data values and lastly converting parallel data sets only composed of least significant bits from said serial data values.

19. A digital image recording and reproducing apparatus comprising:

an image memory for storing image data to be displayed;

a data memory for storing image data;

a serial-to-parallel converter, connected between said image memory and said data memory, for converting serial image data from said image memory into parallel image data;

a parallel-to-serial converter, connected between said image memory and said data memory, for converting parallel image data from said data memory into serial image data; and control means for operating said serial-to-parallel converter when said image data are to be transferred from said image memory to said data memory, and for operating said parallel-to-serial converter when said image data are to be transferred from said data memory to said image memory, wherein said image data stored in said image memory includes a plurality of multi-bit data values, each of which is stored at a unique address in said image memory, said serial-to-parallel converter serially accepting a single bit from each data value and outputting, in parallel, groups of said single bits as said parallel data sets.

20. A digital image recording and reproducing apparatus comprising:

an image memory for storing image data as multi-bit data values to be displayed;

a data memory for storing image data;

a serial-to-parallel converter, connected between said image memory and said data memory, for converting serial image data from said image memory into parallel image data;

a parallel-to-serial converter, connected between said image memory and said data memory, for converting parallel image data from said data memory into serial image data;

control means for operating said serial-to-parallel converter when said image data are to be transferred from said image memory to said data memory, and for operating said parallel-to-serial converter when said image data are to be transferred from said data memory to said image memory; and an output switch positioned between and operated to separately connect each output terminal of said image memory and an input terminal of said serial-to-parallel converter, each of said output terminals having a one-to-one relation with a corresponding bit location in each of said multi-bit data values, wherein said output switch includes a movable contact that maintains a connection between one of said output terminals and said input terminal until every bit corresponding to said one output terminal is transferred to said data memory.

21. A digital image recording and reproducing apparatus comprising:

an image memory for storing image data as multi-bit data values to be displayed;

a data memory for storing image data;

a serial-to-parallel converter, connected between said image memory and said data memory, for converting serial image data from said image memory into parallel image data;

a parallel-to-serial converter, connected between said image memory and said data memory, for converting parallel image data from said data memory into serial image data;

control means for operating said serial-to-parallel converter when said image data are to be transferred from said image memory to said data memory, and for operating said parallel-to-serial converter when said image data are to be transferred from said data memory to said image memory; and a selector switch, connected to said control means, for selecting a maximum number of bits for each multi-bit data value to be transferred to said image memory, in order to stop data transfer from said data memory to said image memory before every bit in each of said multi-bit data values is transferred.

22. A digital image recording and reproducing apparatus comprising:

image memory for storing image data including a plurality of multi-bit data values, wherein each of said multi-bit data values is stored at a unique address in said image memory;

data memory for storing converted image data including a plurality of multi-bit data sets, wherein each of said multi-bit data sets is stored at a unique address in said data memory, each of said multi-bit data sets including one bit from each multi-bit data value in a group of multi-bit data values from said plurality of multi-bit data values;

a serial-to-parallel converter, connected between said image and data memory, for converting said multi-bit data values into multi-bit data sets;

a parallel-to-serial converter, connected between said image and data memory, for converting said multi-bit data sets back into multi-bit data values;

a controller for operating said serial-to-parallel and parallel-to-serial converters to transfer image data between said image and data memory; and an output switch positioned between and operated to separately connect each output terminal of said image memory and an input terminal of said serial-to-parallel converter, each of said output terminals having a one-to-one relation with a corresponding bit location in each of said multi-bit data values, wherein said output switch includes a movable contact that maintains a connection between one of said output terminals and said input terminal until every bit corresponding to said one output terminal is transferred to said data memory.

23. A digital image recording and reproducing apparatus comprising:

image memory for storing image data including a plurality of multi-bit data values, wherein each of said multi-bit data values is stored at a unique address in said image memory;

data memory for storing converted image data including a plurality of multi-bit data sets, wherein each of said multi-bit data sets is stored at a unique address in said data memory, each of said multi-bit data sets including one bit from each multi-bit data value in a group of multi-bit data values from said plurality of said multi-bit data values;

a serial-to-parallel converter, connected between the image and data memory, for converting said multi-bit data values into multi-bit data sets;

a parallel-to-serial converter, connected between said image and data memory, for converting said multi-bit data sets back into multi-bit data values;

a controller for operating said serial-to-parallel and parallel-to-serial converters to transfer image data between said image and data memory; and a selector switch connected to the control means, for selecting a maximum number of bits for each multi-bit data value to be transferred to said image memory in order to stop data transfer from said data memory to said image memory before every bit in each multi-bit data value is transferred.

* * * * *